United States Patent [19]

Wakai et al.

[11] Patent Number: 5,055,899
[45] Date of Patent: Oct. 8, 1991

[54] THIN FILM TRANSISTOR

[75] Inventors: Haruo Wakai, Fussa; Nobuyuki Yamamura, Hachioji; Syunichi Sato, Kawagoe; Minoru Kanbara, Hachioji, all of Japan

[73] Assignee: Casio Computer Co., Ltd., Tokyo, Japan

[21] Appl. No.: 503,270

[22] Filed: Apr. 2, 1990

Related U.S. Application Data

[63] Continuation-in-part of Ser. No. 241,304, Sep. 7, 1988, abandoned.

[30] Foreign Application Priority Data

Sep. 9, 1987 [JP] Japan .................. 62-225819
Sep. 25, 1987 [JP] Japan .................. 62-241607
Oct. 1, 1987 [JP] Japan .................. 62-248878

[51] Int. Cl.$^5$ .................. H01L 29/78
[52] U.S. Cl. .................. 357/23.7; 357/2; 357/4; 359/59; 359/87
[58] Field of Search .................. 357/2, 4, 23.7; 350/334, 336, 339 F, 339 D, 339 R

[56] References Cited

U.S. PATENT DOCUMENTS

| | | |
|---|---|---|
| 3,765,747 | 10/1973 | Pankratz . |
| 3,840,695 | 10/1974 | Fischer . |
| 3,862,360 | 1/1975 | Dill . |
| 4,115,799 | 9/1978 | Luo et al. . |
| 4,413,883 | 11/1983 | Baraff et al. . |
| 4,514,253 | 4/1985 | Minezaki . |
| 4,582,395 | 4/1986 | Morozumi . |
| 4,601,097 | 7/1986 | Shimbo . |
| 4,646,424 | 3/1987 | Parks et al. . |
| 4,704,002 | 11/1987 | Kikuchi et al. ............... 350/334 |
| 4,704,559 | 11/1987 | Suginoya et al. ............... 350/334 |
| 4,705,358 | 11/1987 | Yamazaki . |
| 4,733,948 | 3/1988 | Kitahara ............... 350/334 |
| 4,758,896 | 7/1988 | Ito . |
| 4,788,445 | 11/1988 | Hatanaka . |
| 4,816,885 | 3/1989 | Yoshida et al. . |
| 4,821,092 | 4/1989 | Noguchi . |
| 4,853,755 | 8/1989 | Okabe . |
| 4,862,237 | 8/1989 | Morozumi . |
| 4,928,161 | 5/1990 | Kobayashi . |
| 4,935,792 | 6/1990 | Tanaka et al. . |

FOREIGN PATENT DOCUMENTS 41-8172 4/1941 Japan .
44-5572 2/1944 Japan .
55-32026 3/1980 Japan .

(List continued on next page.)

OTHER PUBLICATIONS

The TFT-A New Thin-Film Transistor, Paul K. Weimer, Proceedings of the IRE, pp. 1462-1469, Jun., 1962.
IEEE Transactions on Electron Devices, Nov. 1973, vol. ED-20, No. 11, T. P. Brody et al, "A 6×6 Inch 20 Lines-Per-Inch Liquid-Crystal Display Panel", pp. 995-1001.
Snell et al, "Application of Amorphous Silicon Field Effect Transistors in Addressable Liquid Crystal Display Panels", Appl. Phys., vol. 24, pp. 357-362, 1981.

Primary Examiner—Rolf Hille
Assistant Examiner—Steven Loke
Attorney, Agent, or Firm—Frishauf, Holtz, Goodman & Woodward

[57] ABSTRACT

A thin film transistor comprising a gate electrode, a gate insulating film, and a semiconductor layer, which have the same shape and the same size and stacked one upon another. The transistor further comprises an n-type semiconductor layer formed on the semiconductor layer, an ohmic electrode formed on the n-type semiconductor layer, and a source electrode and a drain electrode both formed on the ohmic electrode. Further, a transparent electrode is electrically connected to the source electrode. The thin film transistor has no step portions. Therefore, the transistor can be manufactured with high yield, and forms a pixel having a high opening ratio.

9 Claims, 16 Drawing Sheets

FOREIGN PATENT DOCUMENTS

| | | |
|---|---|---|
| 56-69683 | 6/1981 | Japan . |
| 56-140321 | 11/1981 | Japan . |
| 57-20778 | 2/1982 | Japan . |
| 58-21784 | 2/1983 | Japan . |
| 58-114453 | 7/1983 | Japan ................................ 357/2 |
| 59-15499 | 4/1984 | Japan . |
| 60-43631 | 3/1985 | Japan . |
| 60-92663 | 5/1985 | Japan . |
| 60-170261 | 9/1985 | Japan ................................ 357/2 |
| 61-5576 | 1/1986 | Japan . |
| 61-5577 | 1/1986 | Japan . |
| 61-153619 | 7/1986 | Japan . |
| 61-187272 | 8/1986 | Japan ............................ 357/23.7 |
| 60-191072 | 8/1986 | Japan ................................ 357/4 |
| 61-220369 | 9/1986 | Japan . |
| 62-8569 | 1/1987 | Japan . |
| 62-8570 | 1/1987 | Japan . |
| 63-128756 | 6/1988 | Japan . |
| 63-197377 | 8/1988 | Japan . |
| 64-48463 | 2/1989 | Japan . |
| 1-105575 | 4/1989 | Japan . |
| 1-137674 | 5/1989 | Japan . |
| 61-185522 | 7/1989 | Japan . |
| 1-227475 | 9/1989 | Japan . |

F I G. 4A 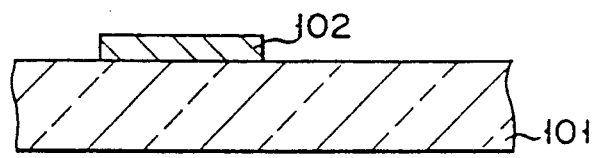
F I G. 4B 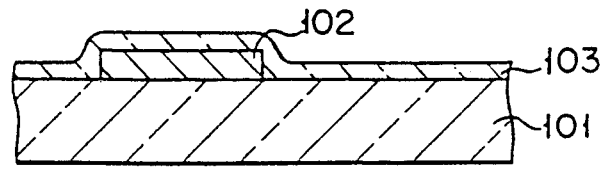
F I G. 4C 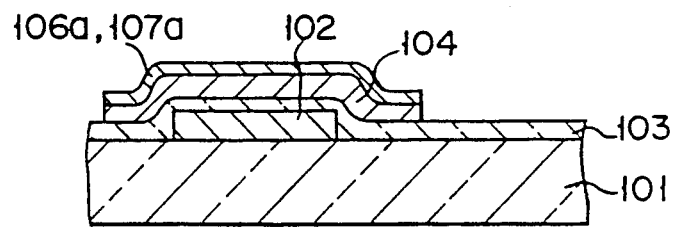
F I G. 4D 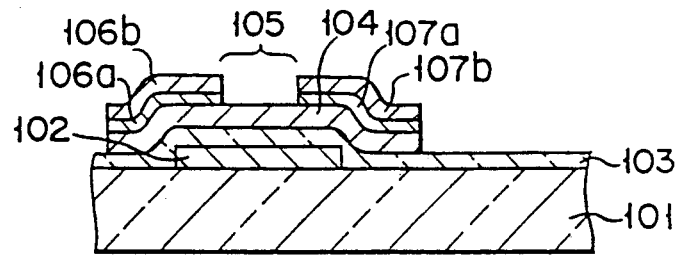
F I G. 4E 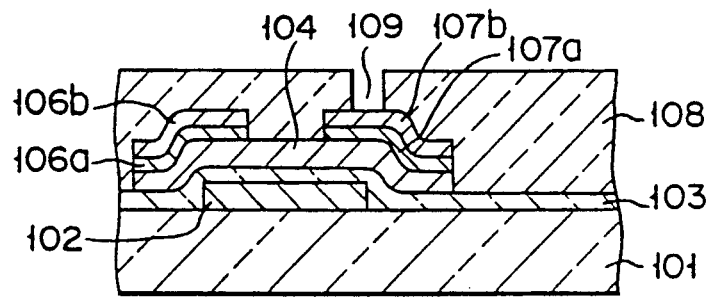
F I G. 4F 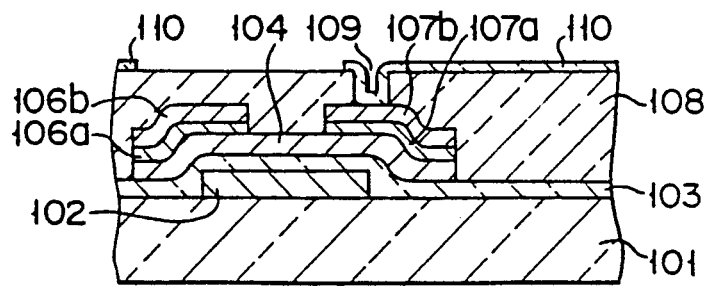

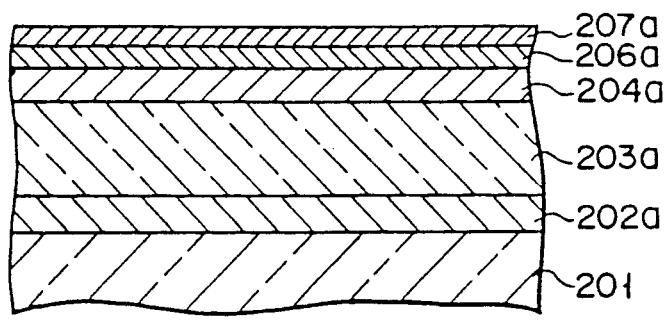
F I G. 15A
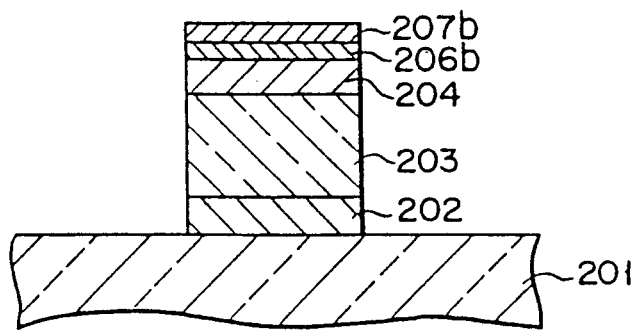
F I G. 15B
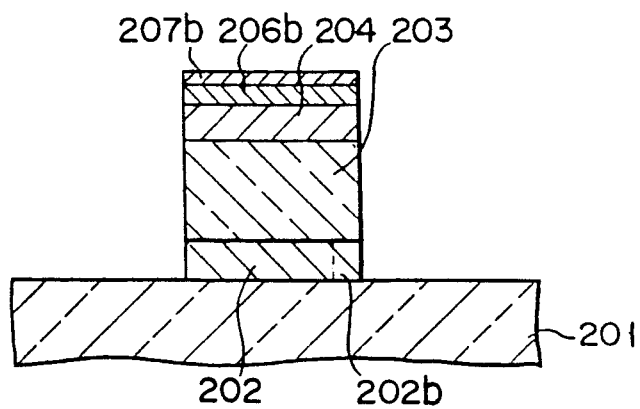
F I G. 15C
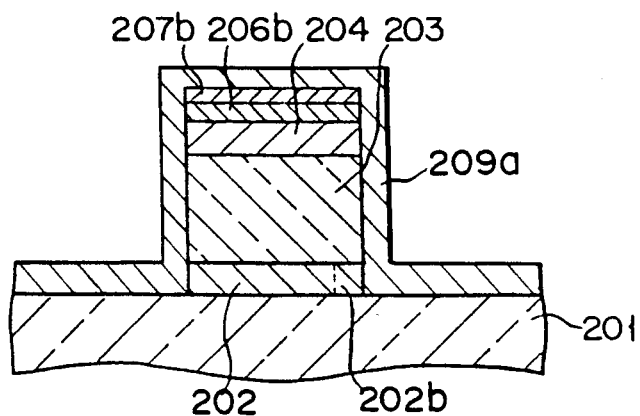
F I G. 15D

THIN FILM TRANSISTOR

CROSS-REFERENCE TO THE RELATED APPLICATIONS

This is a continuation-in-part of application Ser. No. 241,304, filed on Sept. 7, 1988, now abandoned.

BACKGROUND OF THE INVENTION

1. Field of the Invention

The present invention relates to a thin film transistor (referred to as a TFT hereinafter) formed by stacking thin films, such as a gate electrode, a gate insulating film, a semiconductor, a source electrode, and a drain electrode, on a transparent insulating substrate, and a method of manufacturing the same.

2. Description of the Related Art

Conventional TFTs as switching elements are disclosed in Published Examined Japanese Utility Model Application No. 44-5572 (USSN 132095), Published Examined Japanese Patent Application No. 41-8172 (USSN 344921), and P. K. Weimer, "The TFT - A New Thin-Film Transistor", PROCEEDINGS OF THE IRE, June, 1962. Liquid crystal display panels using such TFTs are disclosed in "A 6×6 Inch 20 Lines-Per-Inch Liquid Crystal Display Panel", IEEE Transactions on Electron Device, vol. ED-20, No. 11, November 1973 and U.S. Pat. No. 3,840,695.

On the other hand, U.S. Pat. Nos. 3,765,747 and 3,862,360, and Published Unexamined Japanese Patent Application (Kokai) Nos. 55-32026, 57-20778, and 58-21784 disclose a technique wherein a MOS transistor is formed on a monocrystalline semiconductor substrate, and the resultant structure is used as one of the substrates of a liquid crystal display panel. However, if liquid crystal panels are constituted by these semiconductor substrates, only reflection type displays can be obtained. In addition, the manufacturing process of such panels are as complex as that of LSIs. Moreover, it is difficult to obtain a large display panel.

The above-described active matrix liquid crystal panels, therefore, currently use the TFTs as switching elements. The structures of these TFTs can be classified into a coplanar type, an inverted coplanar type, a staggered type, and an inverted staggered type, as disclosed in the article by P. K. Weimer. Of these types, the inverted staggered type TFT can be formed by stacking a plurality of thin films successively in a vacuum. For this reason, the number of manufacturing steps is substantially decreased. As a result, the characteristics of a product are stabilized, and the rate of occurrence of defective transistors is decreased.

FIGS. 1 and 2 show structures of the above-described inverted staggered type TFT and a TFT array obtained by arranging a plurality of such inverted staggered type TFTs on an insulating substrate. Referring to FIGS. 1 and 2, a plurality of TFTs 1 are arranged on a transparent insulating substrate 2 in the form of a matrix. Gate electrodes 3 of TFTs 1 are connected by a gate line 4 extending in the row direction. Drain electrodes 5 of TFTs 1 are connected by a drain line 6 extending in the column direction. A source electrode 7 of each TFT 1 is connected to a transparent electrode 8 formed in an area surrounded by the gate and drain lines 4 and 6 (an electrode to which a data signal is supplied will be referred to as a drain electrode hereinafter). More specifically, as shown in FIG. 2, the gate electrode 3 consisting of Cr or the like is formed on the transparent glass substrate 2, and a gate insulating film 9 consisting of silicon oxide or silicon nitride is formed on the upper surface of the glass substrate 2 and also the upper surface of the gate electrode 3. A semiconductor film 10 consisting of amorphous silicon is stacked on the gate insulating film 9 above the gate electrode 3. Drain and source electrodes 5 and 7 are formed on the semiconductor film 10. They are separated from each other by a predetermined distance so as to form channel portion 11. Drain and source electrodes 5 and 7 respectively have contact layers 5a and 7a, and metal layers 5b and 7b, and are electrically connected to the semiconductor 10. The source electrode 7 is connected to the transparent electrode 8 consisting of Indium-Tin-Oxide (to be referred to as an ITO hereinafter).

In the TFT used for the above-described TFT array, since part of the drain electrode 5, the drain line 6, and the transparent electrode 8 are formed on the gate insulating film 9, both the electrodes tend to be short-circuited, and hence the rate of occurrence of defects becomes high. Especially in the TFT array using this TFT, since the transparent electrode 8 is formed in a region surrounded by the gate and drain lines 4 and 6, short-circuiting tends to occur between the transparent electrode 8 and drain line 6.

In order to prevent such short-circuiting, predetermined distance L determined by process and alignment precision of forming of the transparent electrode 8 and the drain line 6 is formed therebetween. Distance L is long, e.g., 20 μm or more. By virtue of the long distance L, the above-described short-circuiting can be prevented, the area of the transparent electrode 8 is reduced. That is, the effective display area is inevitably reduced. For example, the opening ratio, i.e., the ratio of the area of the transparent electrode 8 to an area for arranging one TFT and one transparent electrode on the glass substrate 2 becomes as small as about 50% even if distance L is set to be a minimum value of 20 μm.

As has been described, with reference to Japanese Patent Disclosure (Kokai) No. 55-32026, in the transistor array obtained by arraying MOS transistors using the monocrystalline semiconductor substrate, the upper surface of the substrate is uneven because of the formation of the transistors. Therefore, in order to smoothen the upper surface, thereby to a uniform orientation film, an insulating film is deposited on the transistors, and reflecting electrodes for receiving data signals are formed on the insulating film. In such a transistor having a MOS structure, since the gate electrode is formed on the semiconductor substrate, an unnecessary electric filed is not applied to the channel portion by a data signal supplied to the transparent electrode formed above the channel portion.

In the inverted staggered type TFT described above, however, since the gate electrode is formed on the substrate, electric fields tend to be applied to the semiconductor film from electrodes other than the gate electrode.

It is, therefore, difficult to obtain a TFT which can stably operate without causing short-circuiting between the drain electrode and drain line on the one hand, and the transparent electrode connected to the source electrode on the other, and can be easily manufactured.

SUMMARY OF THE INVENTION

The present invention has been made in consideration of the above-described technical problems, and has as its object to provide a TFT which can be stably operated, has a small rate of occurrence of defects, and can be easily manufactured.

In order to achieve this object, a TFT according to the present invention comprises:

a gate electrode, a gate insulating film, and a first semiconductor layer which have the same shape and size and are stacked one upon another, in the order mentioned;

a second semiconductor layer formed on the end portions of the first semiconductor layer, respectively;

ohmic electrodes formed on the second semiconductor layers, respectively;

a source electrode formed on one of the ohmic electrodes;

a drain electrode formed on the other of the ohmic electrodes;

a transparent electrode electrically connect to the source electrodes; and an insulating film insulating the gate electrode and the transparent electrode from each other.

Since the gate electrode, the gate insulation film, and the semiconductor layer has the same shape and size and stacked one upon another, thus forming an inverted staggered structure, the TFT has no step portions and can, therefore, be manufacture with high yield. Further, since the transparent electrode, i.e., a pixel electrode is formed on the uppermost layer, i.e., the source metal layer, the pixel has a great opening ratio.

BRIEF DESCRIPTION OF THE DRAWINGS

FIGS. 4A to 4F are sectional views explaining the steps of manufacturing the TFT shown in FIG. 3;

FIGS. 15A to 15G are sectional views explaining the steps of manufacturing a TFT according to a third embodiment of the present invention;

DETAILED DESCRIPTION OF THE PREFERRED EMBODIMENTS

A TFT according to the invention, which is an inverted staggered TFT having a pixel electrode, will now described with reference to the accompanying drawings.

Figure 3:
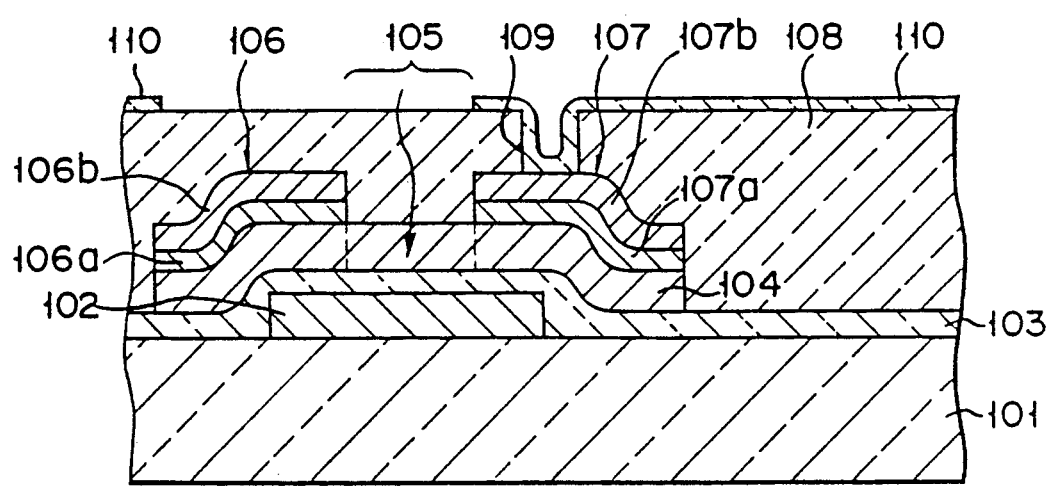
FIG. 3 is a sectional view showing an inverted staggered TFT having a pixel electrode formed on the upper surface.

FIG. 3 is a sectional view illustrating the inverted staggered TFT. A gate electrode 102 made of Cr and having a thickness of about 1,000 Å is formed on an insulating substrate 101 which is a transparent glass plate. A gate insulating film 103 consisting of silicon nitride or silicon oxide and having a thickness of about 3,000 Å is formed on the upper surface of the insulating substrate 101 including the upper surface of the gate electrode 102. A semiconductor film 104 made of amorphous silicon and having a thickness of about 1,000 Å is formed on the gate insulating film 103 so as to cover a portion located above the gate electrode 102 and its peripheral portion. Drain and source electrodes 106 and 107 are formed on the semiconductor film 104. They are separated from each other by a predetermined distance, forming a channel portion 105. In order to electrically connect the drain and the source electrodes 106 and 107 to the semiconductor film 104, the electrodes 106 and 107 are constituted by the contact films 106a and 107a, respectively, each made of amorphous silicon, which is doped with an impurity at a high concentration, and having a thickness of about 500 Å, and conductive layers 106b and 107b each consisting of a conductive metal material such as Cr and having a thickness of about 1,000 Å. In addition, a transparent insulating film 108 made of $SiO_2$, polyimide, or an acrylic resin is deposited on substantially the entire exposed surface above the insulating substrate 101 on which the above-described films are stacked in a predetermined form. The drain electrode 106 is covered with the insulating film 108 and is thereby insulated from other electrodes. The thickness of the insulating film 108 on the drain and the source electrodes 106 and 107 is about 3,000 Å. The insulating film 108 fills recesses generated upon formation of the above thin films and flattens the surface above the insulating substrate 101. A through hole 109 is formed in that portion of the insulating film 108 which is located above the source electrode 107. In addition, a transparent electrode 110 made of ITO and having a thickness of about 1,000 Å is formed on the upper surface of the insulating film 108. The transparent electrode 110 extends into the through hole 109 and hence is electrically connected to the source electrode 107. A portion of the transparent electrode 110 above a channel portion 105 of the semiconductor film 104 formed between the drain and the source electrodes 106 and 107, and its portion above the drain electrode 106 is mostly removed. That is, the transparent electrode 110 above the channel portion 105 must be removed so as to prevent an unnecessary electric field from being applied to the channel portion 105. Furthermore, in order to decrease a parasitic capacitance, the transparent electrode 110 is formed above the drain electrode 106 such that it overlaps the edge of the drain electrode 106. Since the parasitic capacitance is small, the transparent electrode 110 may overlap the drain electrode 106. If the thickness of the insulating film 108 on the drain and the source electrodes 106 and 107 is excessively small, the insulation property is degraded. If it is excessively large, connection to the transparent electrode via through hole 109 formed in the source electrode 107 becomes difficult. For this reason, the insulating film 108 preferably has a thickness falling within the range of 2,000 to 8,000 Å.

In the TFT having the above structure, the insulating film 108 is formed at least on the drain electrode 106. Therefore, the probability of short-circuiting between the drain and the source electrodes 106 and 110 is considerably decreased. In addition, since the transparent electrode 110 is not present above the channel portion 105 of the semiconductor film 104, an unnecessary electric field is not applied to the channel portion 105, and hence the TFT can be stably operated.

It will now be explained how the TFT shown in FIG. 3 is manufactured, with reference to FIGS. 4A to 4F.

As shown in FIG. 4A, a metal film having a thickness of, e.g., about 1,000 Å is deposited by sputtering or vapor deposition on the transparent insulating substrate 101 having a cleaned surface. The metal film is patterned by photolithography or the like to form the gate electrode 102. The insulating substrate 101 may consist of glass, quartz, sapphire, or the like. The gate electrode 102 consists of chromium, titanium, tungsten, tantalum, copper, or the like.

As shown in FIG. 4B, the gate insulating film 103 is then formed on the entire surface of the insulating substrate 101 by plasma CVD or the like so as to have a thickness of, e.g., 3,000 Å and cover the gate electrode 102. A silicon nitride (SiN) film, silicon oxide ($SiO_2$) film, or the like is used as the gate insulating film 103. Subsequently, as shown in FIG. 4C, the semiconductor film 104 consisting of amorphous silicon (a-i-Si) or the like and the contact film 106a (107a) consisting of amorphous silicon (a-n+-Si) which is doped with an impurity at high concentration are continuously formed/stacked by plasma CVD or the like on the gate insulating film 103 so as to have thicknesses of, e.g., 1,000 Å and 500 Å, respectively. The semiconductor film 104 and the contact film 106a (107a) are patterned by photolithography or the like so as to cover a portion above the gate electrode 102 and its peripheral portion. Instead of amorphous silicon, amorphous silicon carbide (SiC), tellurium, selenium, gerumanium, cadmium sulfide (CdS), cadmium selenide (CdSe), or the like may be used as a material for semiconductor film 104 and contact film 106a (107a).

A 1,000-Å thick metal film is then formed on the entire surface above the insulating substrate 101 by vapor deposition, sputtering, or the like so as to cover the contact film 106a (107a). The metal film is patterned by photolithography or the like to remove the contact film 106a (107a) above the channel portion 105, thereby forming the drain and the source electrodes 106 and 107 above the gate electrode 102, which are separated from each other by a predetermined distance, as shown in FIG. 4D. Chromium, titanium, tungsten, tantalum, copper, or the like is used as a material for the metal films 106b and 107b of the drain and the source electrodes 106 and 107.

As shown in FIG. 4E, the transparent insulating film 108 is formed above the insulating substrate 101, covering cover at least the drain electrode 106 and flatten the surface. As the transparent insulating film 108, an organic insulating film obtained by spin-coating and baking polyimide or an acrylic resin, or an $SiO_2$ inorganic insulating film (SOG film) obtained by spin-coating and baking a silanol compound is used. The thickness of the transparent insulating film 108 on the drain electrode 106 is about 3,000 Å. Subsequently, the through hole 109 is formed in the transparent insulating film 108 above the source electrode 107 by etching.

Finally, as is shown in FIG. 4F, a transparent conductive material such as ITO, tine oxide ($SnO_2$), or indium oxide ($In_2O_3$) is sputtered on the surface of the transparent insulating film 108 and in the through hole 109, to a thickness of about 1,000 Å. Then, portions of this transparent conductive material, located above the channel portion 105 of the semiconductor film 104 and overlapping the drain electrode 106 through the transparent insulating film 108 are removed. With the above process, fabrication of the TFT is completed.

According to the above-described manufacturing method, the step of forming the transparent electrode 110 in which a defect generally tends to occur, is the last step. Thus, even if a defect occurs in this step, the immediately preceding step can be repeated, thereby reducing the ratio of occurrence of defects.

Figure 5:
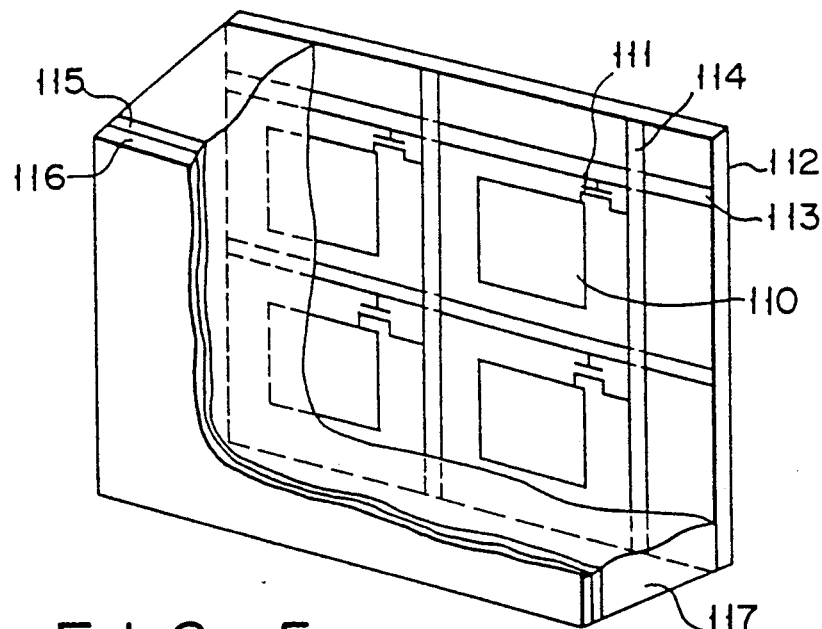
FIG. 5 is a partly broken-away perspective view showing a liquid crystal display element comprising the TFT shown in FIG. 3.
Figure 6:
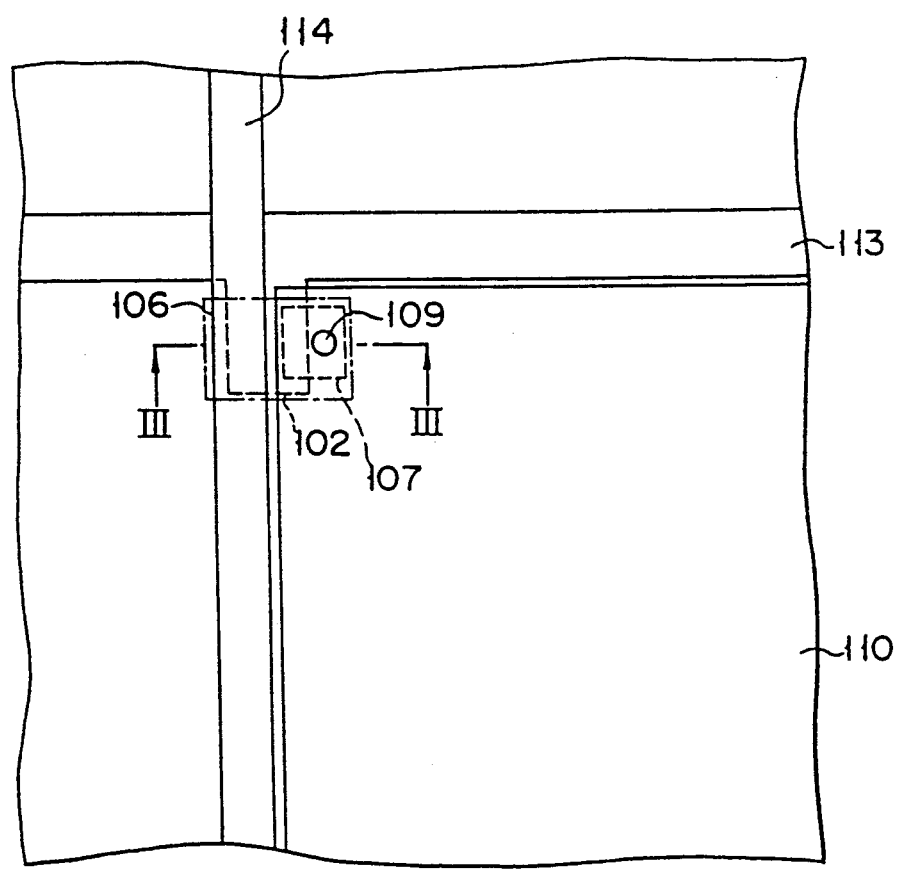
FIG. 6 is a partially enlarged view illustrating an array of a plurality of TFTs.

As shown in FIGS. 5 and 6, a plurality of TFTs of FIG. 3 are arranged on a transparent insulating substrate in the form of a matrix, and are used as a liquid crystal display device. More specifically, a plurality of TFTs 111 are arrayed on a transparent insulating substrate 112 in the column and the row directions. Gate electrodes 102 of the respective are connected to gate line 113 in the row direction. Drain electrodes 106 of the respective TFTs are connected to a drain line 114 extending in the column direction. Source electrodes 107 of TFTs 111 are connected to transparent electrodes 110, which are substantially formed into squares, through through holes 109. The transparent electrodes 110 are respectively arranged in a plurality of regions surrounded by the gate and the drain lines 113 and 114, and are electrically independent from each other. The edges of each transparent electrode 110 are located near the gate and the drain lines 113 and 114, or slightly overlap them. The above-described sectional structure shown in FIG. 3 corresponds to a sectional structure taken along line III—III in FIG. 6.

A transparent substrate 116 having a transparent electrode 115 formed on its entire surface is placed on the substrate on which TFTs 111 are arranged in a matrix in the above-described manner so as to oppose the substrate. A liquid crystal display device is obtained by sealing liquid crystal 117 between these substrates. In this liquid crystal display device, one transparent electrode 110 is a pixel electrode corresponding to one pixel for image display. These pixel electrodes do not overlap the channel portions of the TFTs connected to the adjacent pixel electrodes, and areas where the pixel electrodes overlap the corresponding drain electrodes are minimized.

The above-described liquid crystal display device is operated in the following manner. Scan signals are sequentially supplied to a plurality of the gate lines 113. Data signals for controlling the ON/OFF states of the respective pixels are supplied to a plurality of the drain lines 114 in accordance with the timings of the scan signals. TFT 111 whose gate electrode 102 has received a scan signal is turned on, reads a data signal supplied at that timing, and supplies it to the pixel electrode 110. An electric field is applied to the liquid crystal 117 located between the pixel electrode which has received the data signal and the transparent electrode 115 of the opposite substrate 116 in accordance with a potential difference between the opposite electrodes. Then, the orientation state of the molecules of the liquid crystal 117 is changed, and thus transmission and interception of light are controlled.

Figure 1:
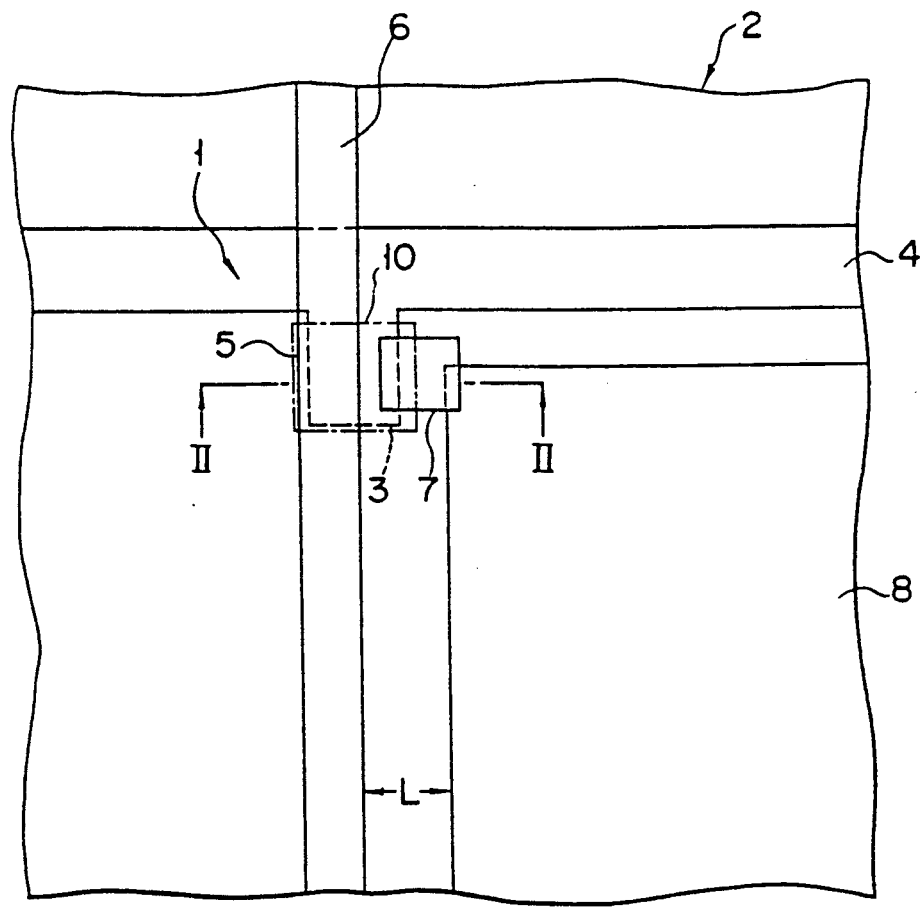
FIG. 1 is a plan view showing a conventional TFT.
Figure 2:
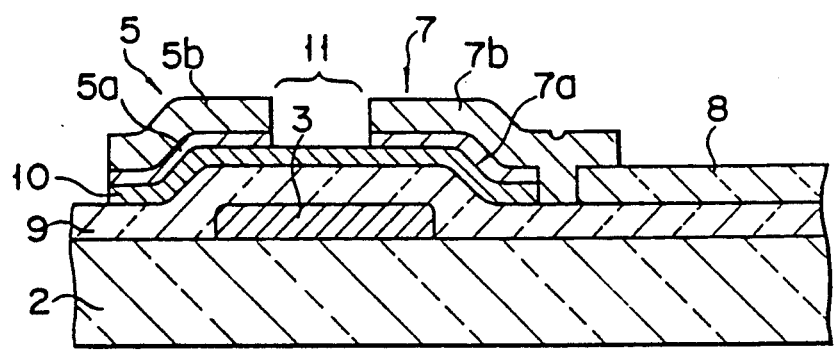
FIG. 2 is a sectional view illustrating the TFT, taken along line II—II in FIG. 1.

As described above, in the liquid crystal display, in which pixel electrodes are formed on TFTs, since the transparent insulating film 108 is formed on at least the drain electrode 106 of the TFT, and the transparent electrode 110 is formed on the resultant structure, short-circuiting between the transparent electrode 110 and the drain electrode 106 can be prevented. In addition, the distance between the transparent electrode 110 and the drain electrode 106, i.e., distance L in FIG. 1, can be set lo be zero. Moreover, the transparent electrode 110 may be arranged so as to overlap the drain and the gate lines 114 and 113. With this arrangement, the entire region except for an opaque region (the semiconductor film 104, the source and the drain electrodes 107 and 106, and the gate and the drain lines 113 and 114) can be made an effective display area, and hence a maximum effective display area can be obtained. According to the embodiment, an opening ratio of 70% can be realized (50% in the conventional device). Since the step of forming the transparent electrode is the last one, and the source electrodes of all the TFTs are commonly connected upon deposition of the transparent conductive film before the step of separating the transparent conductive film individually is executed operations of all the TFTs can be measured within a short period of time by bringing the probe of a measuring device into contact with a plurality of the gate and the drain lines 113 and 114, and the transparent conductive film and supplying test signals.

Modifications of the TFT of FIG. 3 will be described, with reference to FIGS. 7 to 11 and FIGS. 12A to 12C. The same reference numerals in these drawings denote the same parts as FIG. 3, and a description thereof will be omitted.

Figure 7:
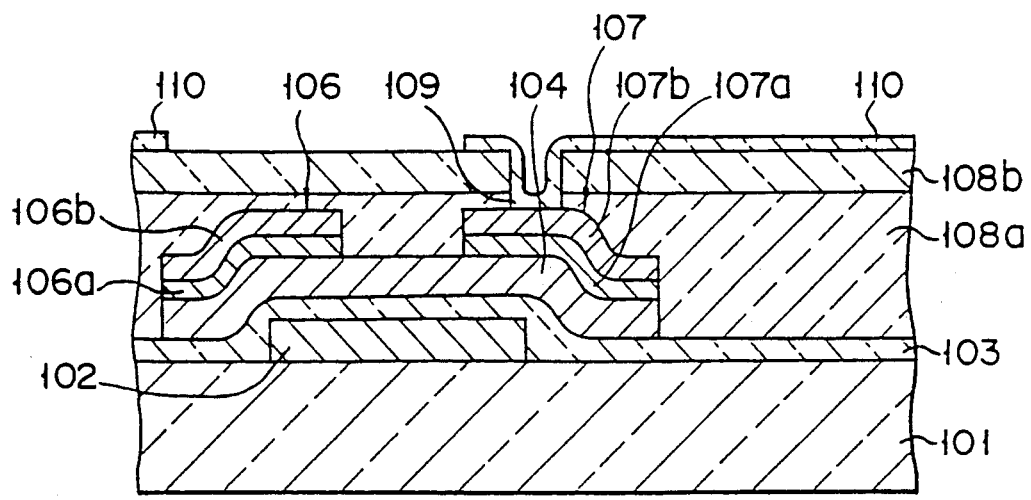
FIG. 7 is a sectional view representing a first modification of the TFT shown in FIG. 3.

FIG. 7 illustrates a first modification of the TFT shown in FIG. 3. A first and a second insulating films 108a and 108b are deposited to cover a drain and a source electrodes 106 and 107, and a transparent electrode 110 is formed on the resultant structure. The first insulating film 108a is an SiO$_2$ film obtained by dissolving a silanol compound in a solvent, coating the resultant solution by a spin coat method, and baking the coated film. The first insulating film 108a is used to flatten the uneven surface above an insulating substrate. The second insulating film 108b is a nitride film obtained by chemical vapor deposition (CVD), and is used to improve an insulation property. The surface above an insulating substrate 101 can be reliably smoothened, and the insulation property and the like can be reliably protected.

Figure 8:
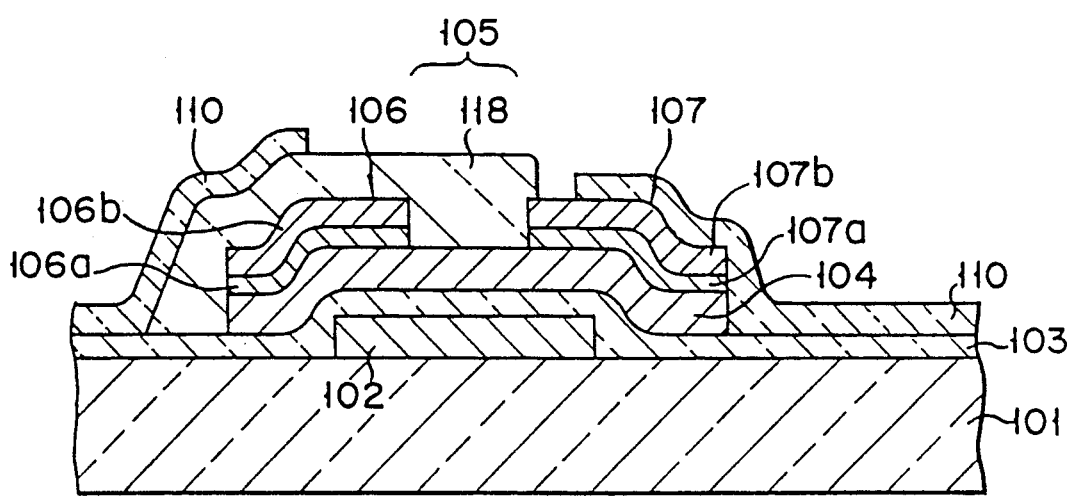
FIG. 8 is a sectional view showing a second modification of the TFT shown in FIG. 3.

FIG. 8 shows a second modification of the TFT shown in FIG. 3. A transparent electrode 110 is formed without flattening the surface above an insulating substrate 101. An insulating film 118 is formed on only a channel portion 105 and a drain electrode 106 so as to protect the channel portion 105 and insulate the drain electrode 106 from the transparent electrode 110. Accordingly, the transparent electrodes 110 of one TFT and an adjacent TFT are not present above the channel portion 105, and the area where the transparent electrode 110 overlaps the drain electrode 106 is small. Therefore, short-circuiting between the transparent electrode 110 and the drain electrode 106 does not occur, and an electric field is not applied from the transparent electrode 110 to the channel portion 105.

Figure 9:
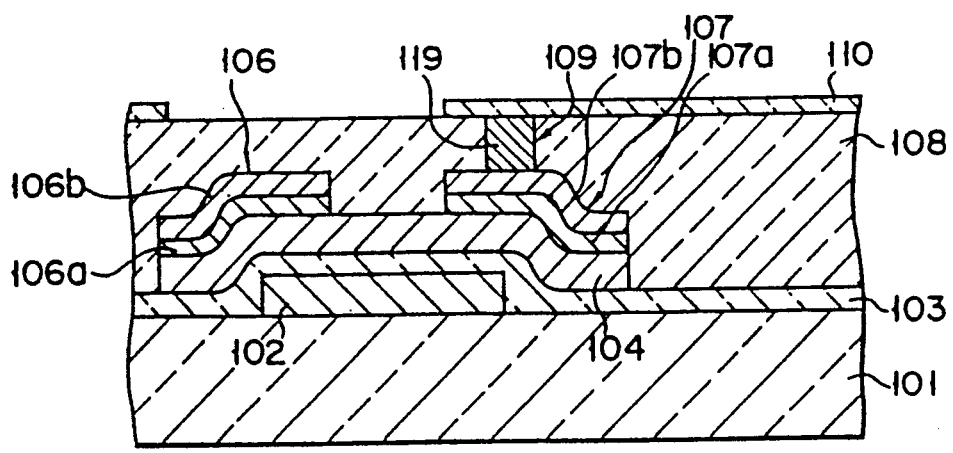
FIG. 9 is a sectional view illustrating a third modification of the TFT shown in FIG. 3.

FIG. 9 shows a third modification of the TFT illustrated in FIG. 3. A contact metal 119 consisting of a conductive metal material is buried in a through hole 109 formed above a source electrode 107, and a transparent electrode 110 is deposited on the resultant structure, thereby electrically connecting the source electrode 107 to the transparent electrode 110. The contact metal 119 consists of nickel, gold, silver, chromium, or the like, and is formed in the through hole 109 by electroless plating. Since the source and the transparent electrodes 107 and 110 are connected to each other through the contact metal 119, electrical connection therebetween can be ensured.

Figure 10:
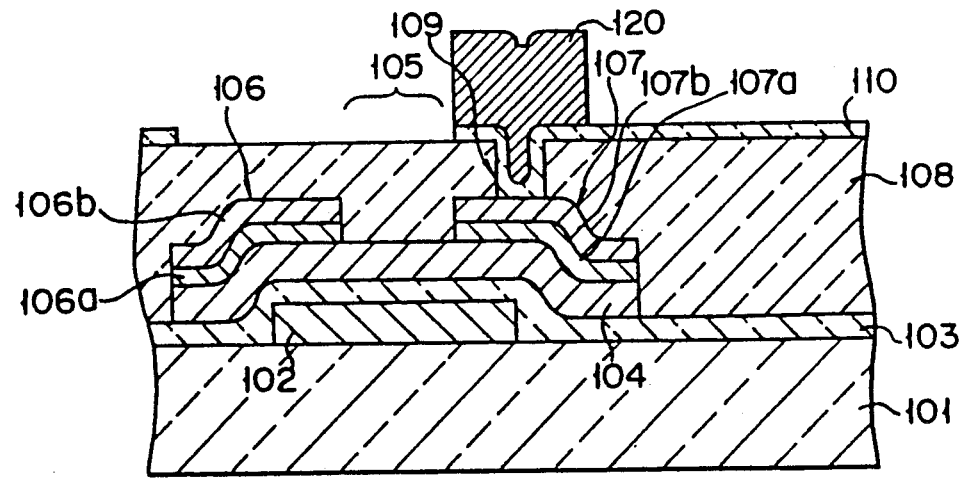
FIG. 10 is a sectional view showing a fourth modification of the TFT shown in FIG. 3.

FIG. 10 shows a fourth modification of the TFT illustrated in FIG. 3. A contact metal 120 consisting of chromium, copper, aluminum, or the like is stacked on a transparent electrode 110, which is electrically connected to a source electrode 107, formed in a through hole 109 of a transparent film 108. The electrical connection between the source and the transparent electrodes 107 and 110 can be ensured.

Figure 11:
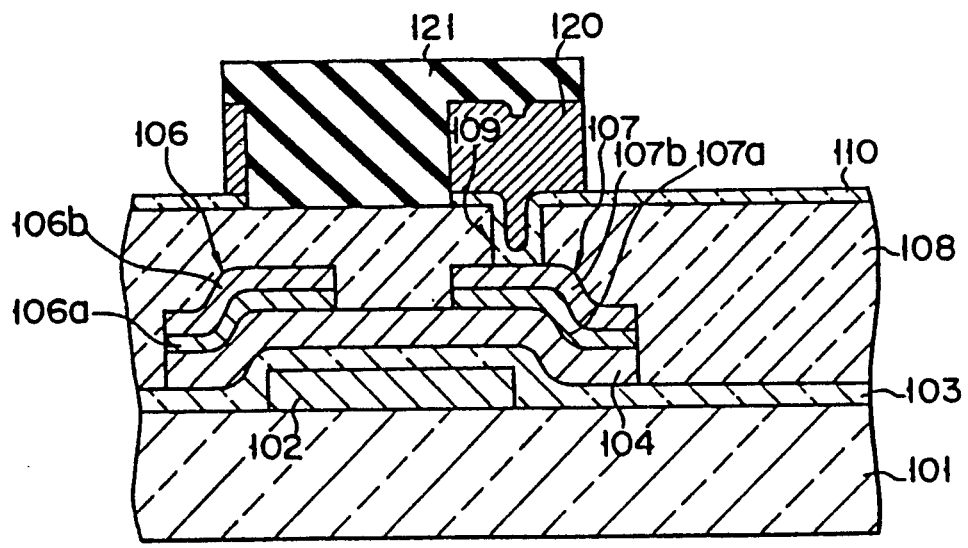
FIG. 11 is a sectional view showing a fifth modification of the TFT shown in FIG. 3.

FIG. 11 illustrates a fifth modification of the TFT shown in FIG. 3. A shield film 121 is formed above a Contact metal 120, a channel portion 105, and a drain electrode 106 of the same types used in the fourth modification (FIG. 11), so as to prevent a decrease in OFF resistance of the TFT due to radiation of external light onto the channel portion 105.

Figure 12A:
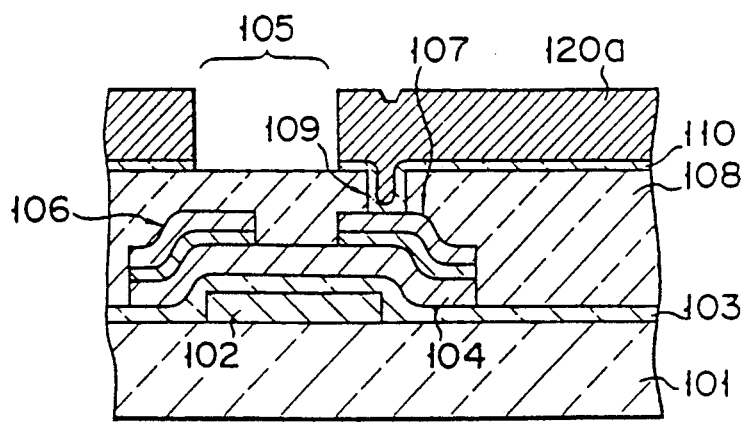
FIGS. 12A to 12C are sectional views explaining the steps of manufacturing the TFT illustrated in FIG. 11.
Figure 12B:
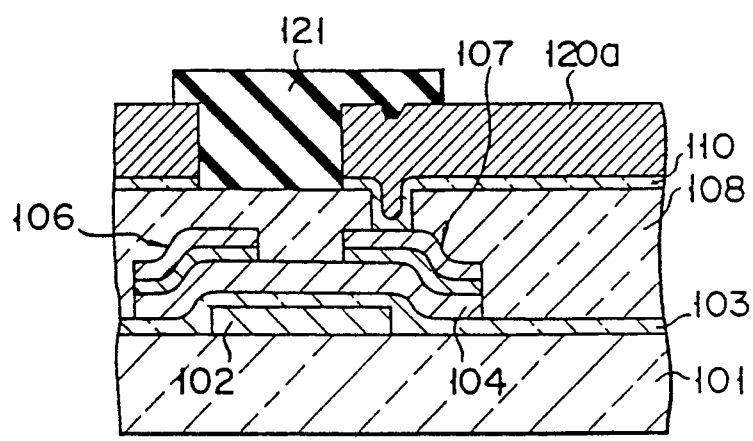
Figure 12C:
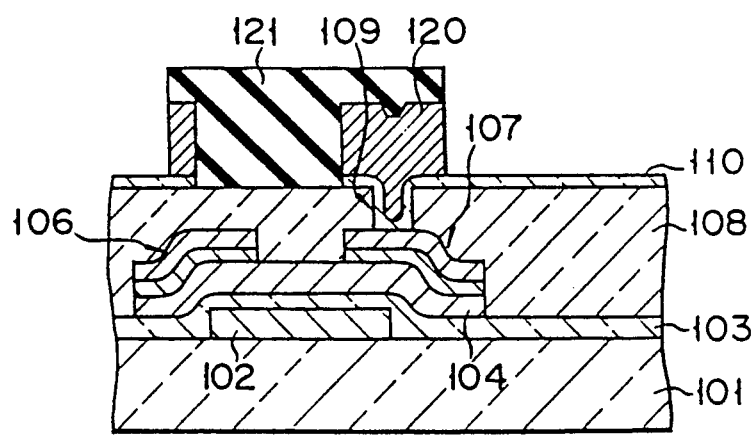

The contact metal 120 and a shield film 121 in the fifth modification are formed in the following manner. As shown in FIG. 12A, a transparent electrode film consisting of ITO and having a thickness of 500 to 1,000 Å and a metal conductive film 120a consisting of chromium, copper, or aluminum and having a thickness twice the depth of a through hole 109, e.g., about 6,000 Å are continuously stacked on the surface above an insulating substrate 101 including a transparent insulating film 108 and the through hole 109, and parts of the films, stacked above the channel portion 105 and on a drain electrode 106 are removed. Subsequently, as shown in FIG. 12B, a shield material consisting of a transparent and insulating resin or a metal oxide is stacked on the resultant structure. Then, the shield material is etched so as to be left on regions, including a region above the through hole 109 of the metal conductive film 120a and a region above the channel portion 105, thereby forming a shield film 121. After this process, as shown in FIG. 12C, the metal conductive film 120a is etched by using the shield film 121 as a resist to remove the metal conductive film 120a from the surface of the transparent electrode 110, thereby forming the contact metal 120 on the through hole 109. In the fifth modification, since the contact metal 120 Is patterned by using the shield film 121 as a resist, the contact metal 120 can be formed substantially without increasing the number of steps in manufacturing.

Figure 13A:
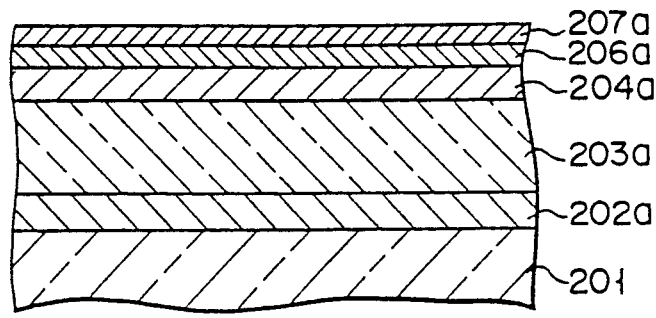
FIGS. 13A to 13G are sectional views explaining the steps of manufacturing a TFT according to a first embodiment of the present invention.

A structure of a TFT to which the present invention can be applied will be described below. FIGS. 13A to 13G show the steps of manufacturing this TFT. FIG. 13G shows a finished TFT. As shown in FIG. 13G, in the TFT, a gate electrode 202, a gate insulating film 203, and a semiconductor film 204 are stacked on a transparent insulating substrate 201 and formed into the same shape. A contact films 206 each consisting of a semiconductor layer having a high impurity concentration, an ohmic contact electrodes 207, and a metal electrodes 209, all pairs of which have the identical shapes, are formed on the semiconductor film 204 so as to be separated from each other by a predetermined distance to form a channel portion 205. A drain and a source electrodes 211 and 10 are respectively constituted by the contact films 06, the ohmic contact electrodes 207, and metal electrodes 209. A transparent insulating film 208 is formed on a portion outside the stacked thin films to the height of the ohmic contact electrode 207. In addition, a pixel electrode 212 is formed on the transparent insulating film 208 so as to be in contact with the metal electrode 209 of the source electrode 210.

The TFT having the above-described arrangement is manufactured in the following manner. As is shown in FIG. 13A, a metal film 202a made of chromium (Cr), molybdenum (Mo), tungsten (W), or the like is deposited on a cleaned surface of the transparent insulating substrate 201 to a thickness of, e.g., 1,000 Å by sputtering, vapor deposition, or the like. An insulating film 203a consisting of silicon nitride (SiN) or the like is deposited on the metal film 202a to a thickness of, e.g., about 3000 Å by plasma CVD or the like. Subsequently, an amorphous silicon (a-i-Si) film 204a and an n+-type amorphous silicon (a-n+-Si) film 206a doped with a high-concentration impurity are respectively deposited on the resultant structure to thicknesses of, e.g., about 1,000 Å and 500 Å by plasma CVD or the like. In addition, an ohmic contact film 207a consisting of Cr, Ti, a noble metal silicide such as PTSi or PT$_2$Si, or the like for an ohmic contact is deposited on the n+-type amorphous silicon 206a by sputtering or the like. The steps of stacking/forming the metal film 202a, the insulating film 203a, the amorphous silicon 204a, the n+-type amorphous silicon 206a, and the ohmic contact film 207a on the transparent insulating substrate 201 are continuously performed by sputtering and plasma CVD.

Figure 13B:
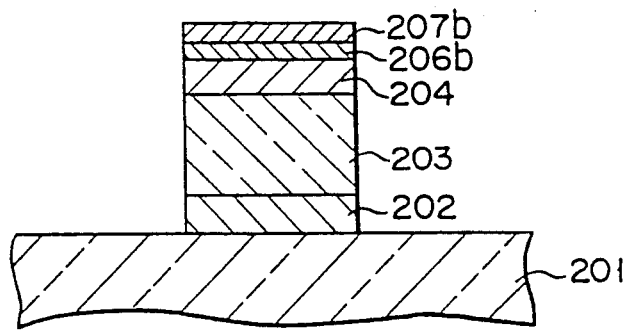
Figure 13C:
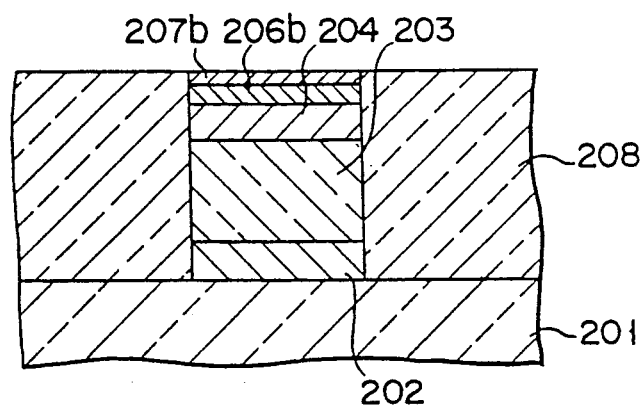
Figure 13D:
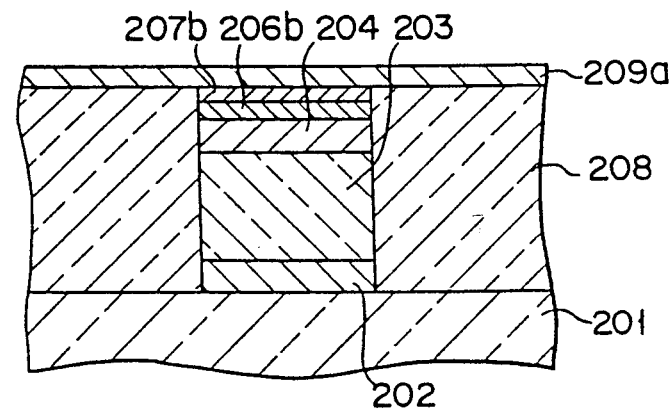

As shown in FIG. 13B, the ohmic contact film 207a, the n+-type amorphous silicon 206a, the amorphous silicon 204a, the insulating film 203a, and the metal film 202a are etched to form the gate electrode 202, a gate line (not shown) for supplying scan signals to the gate electrode 202, the gate insulating film 203, the semiconductor film 204, the contact film portion 206b, and the ohmic contact electrode film 207b. The ohmic contact film 207a, the n+-type amorphous silicon 206a, the amorphous silicon 204a, the insulating film 203a, and the metal film 202a are continuously etched by, e.g., reactive etching. Alternatively, the n+-type amorphous silicon 206a, the amorphous silicon 204a, the insulating film 203a may be etched by plasma etching, and the metal film 202a may be etched by wet etching. Then, as is shown in FIG. 13C, the transparent insulating flattening film 208 consisting of a silica film or an organic substance such as acrylic is spin-coated above the transparent insulating substrate 201 to a height substantially equal to that of the ohmic contact electrode film 207b.

If the flattening film 208 is also coated on the ohmic contact electrode film 207b upon coating, the flattening film 208 on the film 207b is removed by etch back.

Figure 13E:
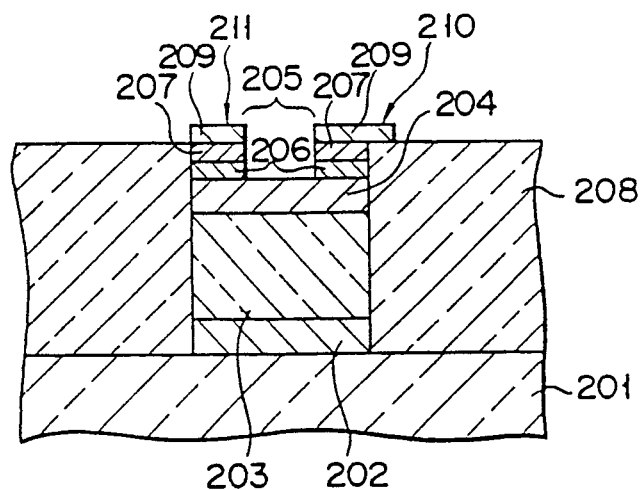

In addition, a metal film 209a having a small specific resistance, such as an aluminum (Al), copper (Cu), or silver (Ag) film, is deposited on the entire surfaces of the ohmic contact electrode film 207b and the flattening film 208 above the transparent insulating substrate 201 by sputtering, vapor deposition, or the like. Then, as is shown in FIG. 13E, the corresponding position of the channel portion 205 of the metal film 209a, the ohmic contact metal film 207b, and the contact film portion 206b are continuously etched respectively by photolithography, to forming the drain and the source electrodes 211 and 210 each consisting of the metal electrode 209, the ohmic contact electrode 207, and the contact film 206, and to form a drain line for supplying image signals to the drain electrode 211.

Figure 13F:
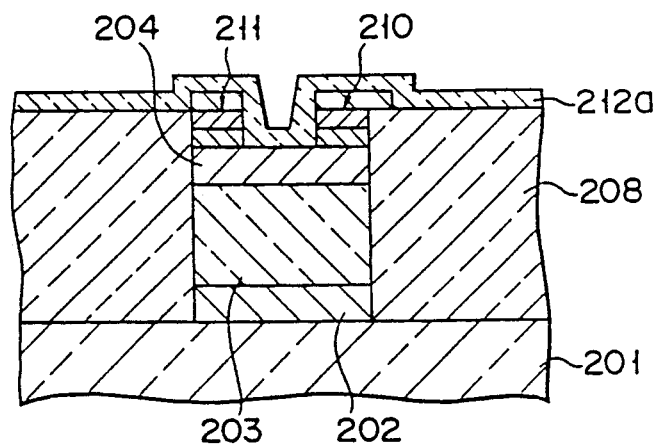
Figure 13G:
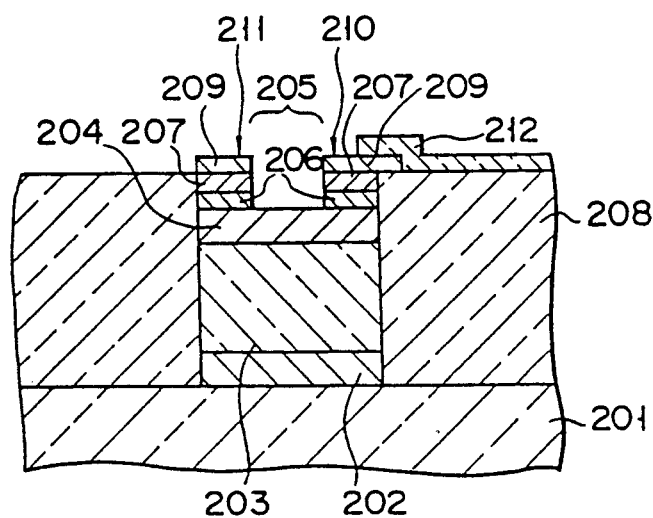

Subsequently, as shown in FIG. 13F, a transparent conductive film 212a such as an ITO film is deposited on the entire surface above the transparent insulating substrate 201 by vapor deposition or the like.

Finally, as shown in FIG. 13G, a pixel electrode 212 is formed by photolithography or the like. With this process, a TFT active matrix panel is completed. In the TFT of this embodiment, since the gate electrode 202, the gate insulating film 203, the semiconductor film 204, the contact film 206, and the ohmic contact electrode 207 can be formed in successive steps, stable characteristics can be obtained. Since the stacked films obtained by the above-described series of steps are continuously etched, the number of steps is decreased.

FIGS. 14A to 14G are sectional views explaining how another TFT according to the invention is manufactured. Before explaining the method of manufacturing this TFT, the TFT will be described with reference to FIG. 14G, in which the same numerals are used to designate the same elements as those illustrated in FIGS. 13A to 13G.

Figure 14A:
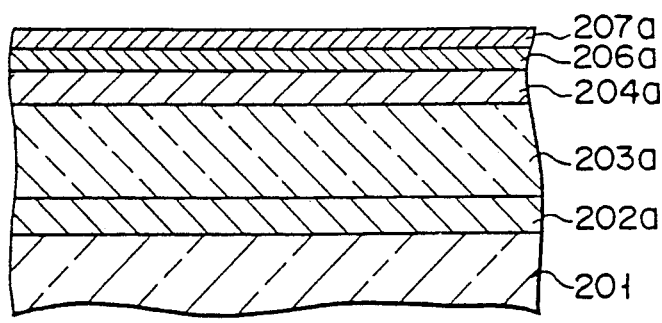
FIGS. 14A to 14G are sectional views for explaining the steps of manufacturing a TFT according to a second embodiment of the present invention.
Figure 14B:
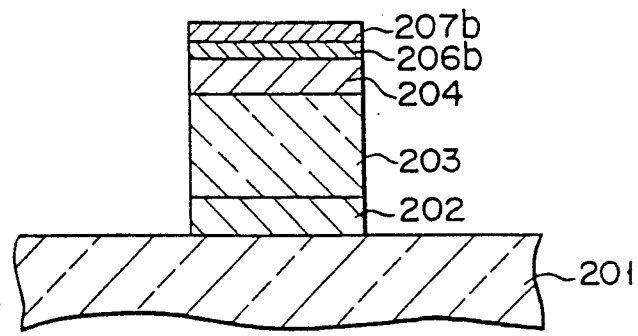
Figure 14C:
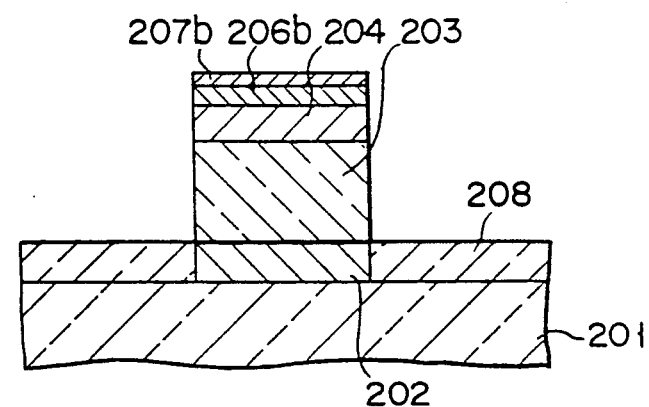
Figure 14D:
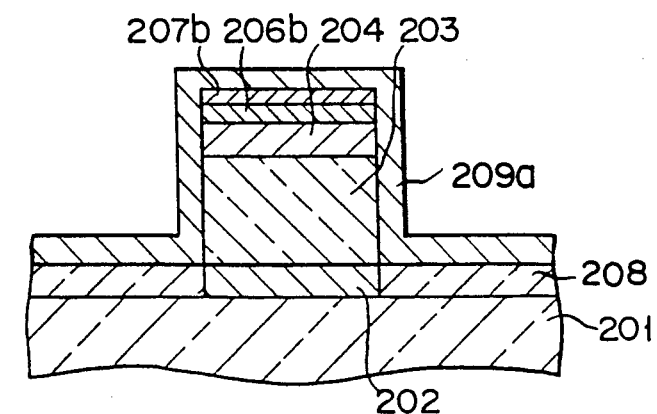
Figure 14E:
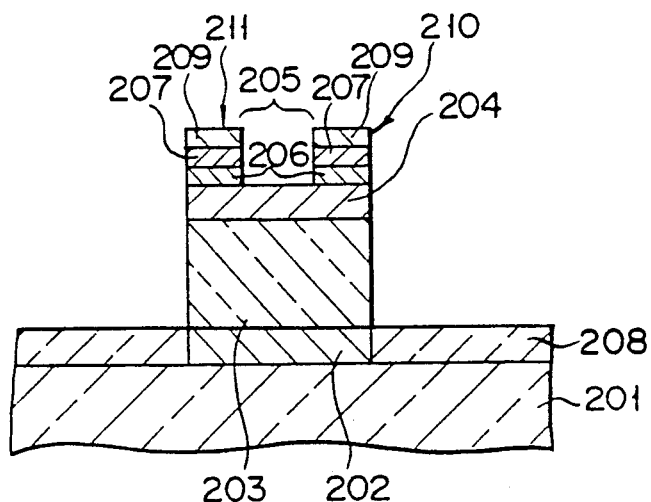
Figure 14F:
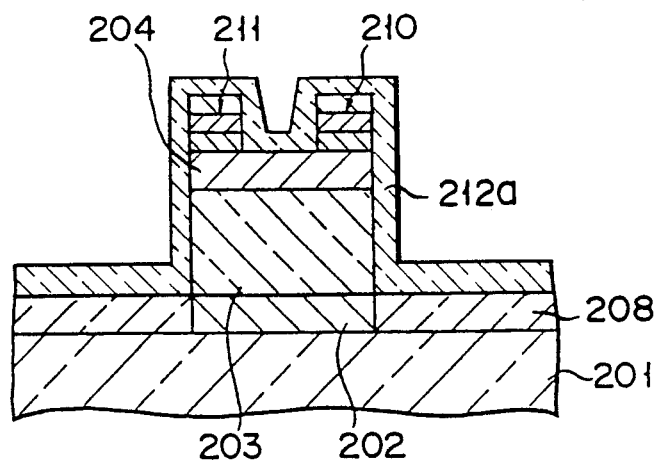
Figure 14G:
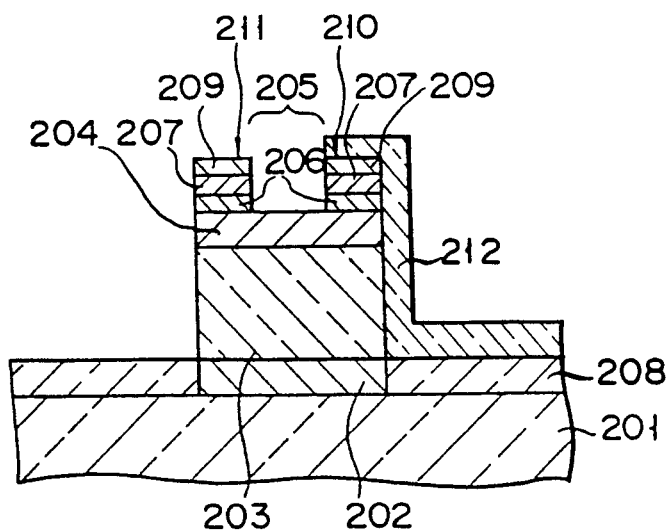

As comparison of FIG. 14G with FIG. 13G may suggests, the TFT of FIG. 14G is different from the TFT of FIG. 13G in that a transparent insulating film 208 is formed on a portion outside the stacked thin films, to the height of an ohmic contact electrode 207. The height of the transparent insulating film 208 is, however, the same as that of a gate electrode 202. The film 208 is provided to prevent the gate electrode 202 from contacting a pixel electrode 212. To accomplish its function, the film 208 needs only to have a height just the same as, or slightly greater than, that of the gate electrode 202.

Since the film 208 has the same height as the gate electrode 202 as is illustrated in FIG. 14G, it is formed of a relatively small amount of transparent material. By virtue of this saving of transparent material, the TFT of FIG. 14G can be manufactured at low cost.

It will now be explained how the TFT shown in FIG. 14G is manufactured, with reference to FIGS. 14A to 14G.

First, as is evident from FIGS. 14A and 14B, the same steps as have been described with reference to FIGS. 13A and 13B are carried out.

Then, as is illustrated in FIG. 14C, the transparent insulating film 208, which is made of silica or organic substance such as acrylic resin, is spin-coated on a transparent insulating substrate 201 to a height substantially equal to that of the gate electrode 202. Should the film 208 be higher than that of the gate electrode 202, the film 208 is etched until its height is reduced to that of the gate electrode 202.

Next, as is shown in FIG. 14D, a metal film 209a is deposited on the substrate 201 by means of sputtering or vapor-deposition, covering all films. The metal film 209 is made of aluminum (Ag), copper (Cu), or silver (Ag). Then, as shown in FIG. 14E, the corresponding position of the channel portion 205 of the metal film 209a, the ohmic contact metal film 207b, and the contact film portion 206b is continuously etched respectively by photolithography to form the drain and the source electrodes 211 and 210 each consisting of the metal electrode 209, the ohmic contact electrode 207, and the contact film 206, and to form a drain line for supplying image signals to the drain electrode 211.

Subsequently, as shown in FIG. 14F, a transparent conductive film 212a such as an ITO film is deposited on the entire surface above the transparent insulating substrate 201 by vapor deposition or the like.

Finally, as shown in FIG. 14G, a pixel electrode 212 is formed by photolithography or the like. With this process, a TFT active matrix panel is completed. In the TFT of this embodiment, since the gate electrode 202, the gate insulating film 203, the semiconductor film 204, the contact film 206, and the ohmic contact electrode 207 can be successively formed in a series of steps, stable characteristics can be obtained. Since the stacked films obtained by the above-described series of steps are continuously etched, the number of steps is decreased.

FIGS. 15A to 15G are sectional views explaining how still another TFT according to the invention is manufactured. Before explaining the method of manufacturing this TFT, the TFT will be described with reference to FIG. 15G, wherein the same numerals are used to designate the same elements as those illustrated in FIGS. 13A to 13G.

Figure 15E:
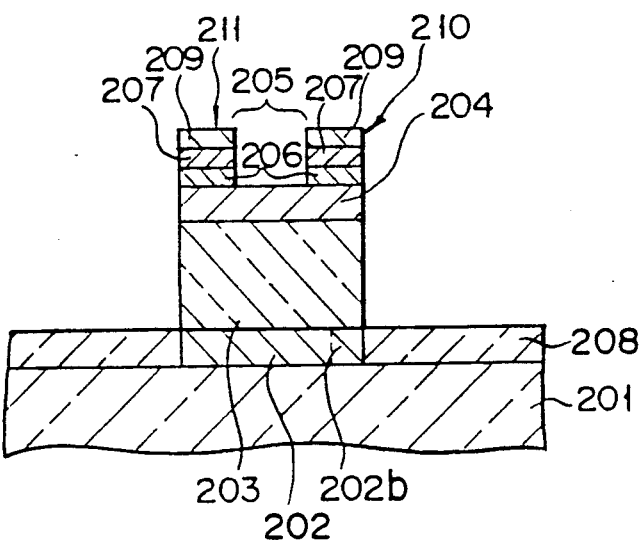
Figure 15F:
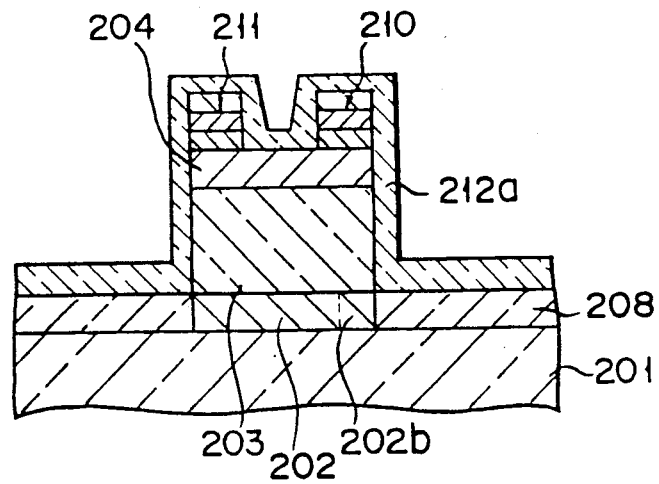
Figure 15G:
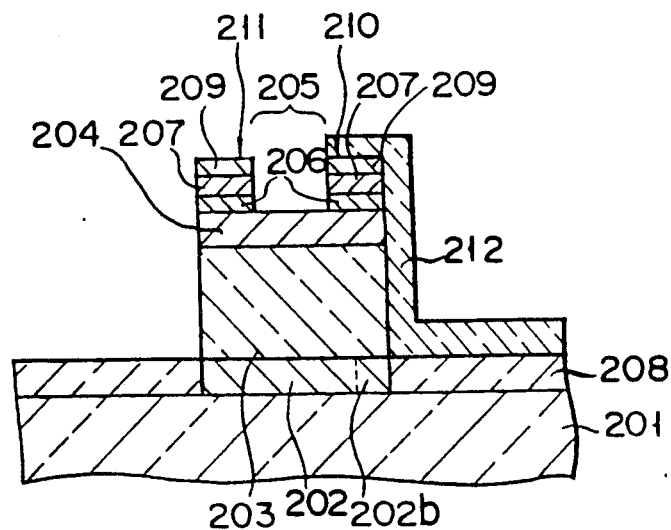

As comparison of FIG. 14G with FIGS. 13G and 14G may suggests, the TFT of FIG. 15G is different from the TFTs of FIGS. 13G and 14G in that no elements equivalent to the transparent insulating film 208 are provided, and that part of a gate electrode 202 which contacts the pixel electrode 212 of a gate electrode 202 is subjected to anodic oxidation, thus rendered electrically insulative, and used as an insulating part 202b. Therefore, the film insulating part 202b prevents the gate electrode 202 from contacting the pixel electrode 212. Since no elements equivalent to the transparent insulating film 208 are required, the transparent material is saved, the TFT of FIG. 15G can be manufactured at lower cost than the TFTs illustrated in FIGS. 13G and 14G.

It will now be explained how the TFT shown in FIG. 15G is manufactured, with reference to FIGS. 15A to 15G.

First, as is evident from FIGS. 14A and 14B, the same steps as have been described with reference to FIGS. 13A and 13B are carried out.

Then, as illustrated in FIG. 15C, the gate electrode 202 made of aluminum (Al) is subjected to anodic oxidation, thereby forming the insulating part 202b. More specifically, an electrolyte (e.g., boric acid or tartaric acid) is applied to that part of the electrode 202 which contact the pixel electrode 212, and a current is supplied through the electrode 202. Then, said part of the electrode 202 is oxidized into alumina (Al$_2$O$_3$), which is electrically insulative. The insulating part 202b needs only to be thick enough to insulate the electrode 202 electrically from the electrode 209a.

Thereafter, the same steps as have been explained with reference to FIGS. 14D to 14G are carried out, as is evident from FIGS. 15D to 15G, thereby manufacturing the TFT shown in FIG. 15G. This TFT can also be manufactured in less steps than the conventional TFT.

Figure 16:
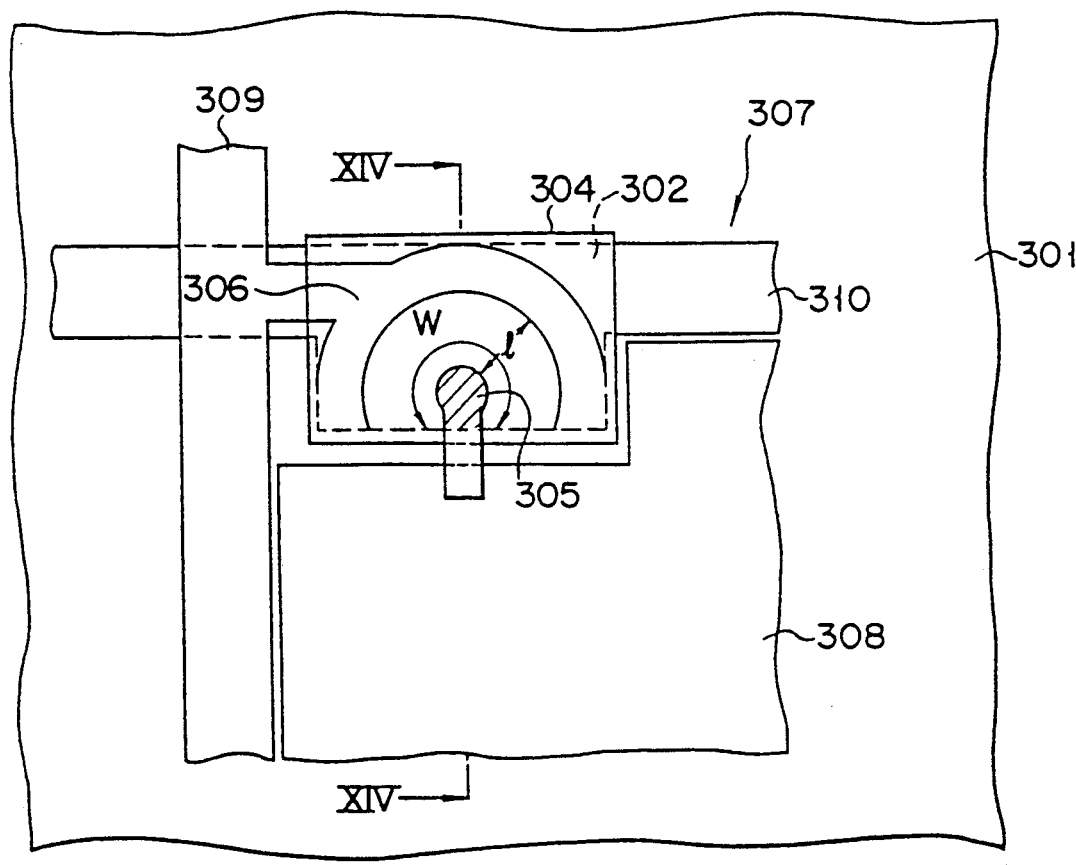
FIG. 16 is a plan view illustrating another TFT according to the present invention.
Figure 17:
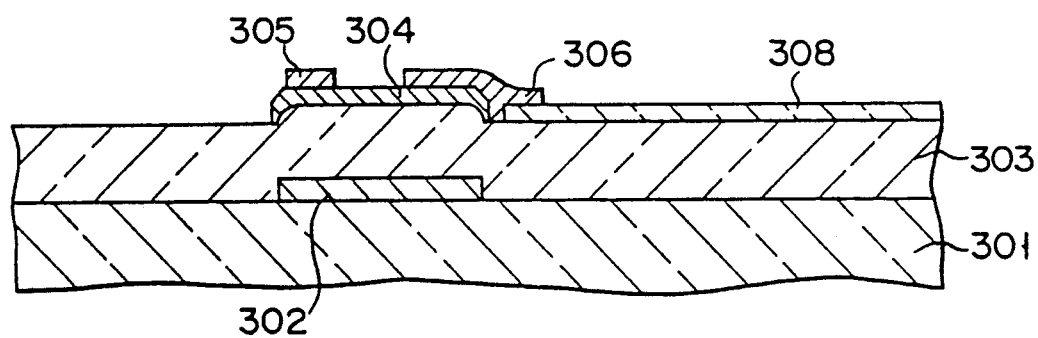
FIG. 17 is a sectional view showing the TFT illustrated in FIG. 16, taken along line XIV—XIV in FIG. 16.

Another TFT according to the invention will now be described, with reference to FIGS. 16 and 17. As is shown in these figures, a gate electrode 302 is formed on a glass substrate 301, and a gate insulating film 303 made of silicon nitride and having a thickness of about 3,000 Å is formed on the gate electrode 302. A semiconductor film 304 made of amorphous silicon is sacked on part of the gate insulating film 303, which corresponds to the gate electrode 302. A circular source electrode 305 is formed on the semiconductor film 304. The source electrode 305 has a diameter of, e.g., about 4 μm. A drain electrode 306 is formed in an annular shape on the semiconductor film 304 substantially concentrically with the source electrode 305, thereby forming a semiconductor channel portion in a partial annular shape between the two electrodes. Since the channel portion is formed so as to surround the source electrode 305, if the distance between the two electrodes is a channel length l, and the length of an arc defined by substantially intermediate points of the channel length g is a channel width W, the channel width W is sufficiently larger than the channel length l. Ratio l/W of the channel length l to the channel width W is one or less.

A plurality of TFTs 307 each arranged in the above-described manner are arrayed on the substrate 301 in the form of a matrix. The source electrode 305 of TFT 307 is connected to a pixel electrode 308 consisting of a transparent conductive substance. The drain electrodes 306 of TFTs 307 arranged in the column direction are commonly connected to a drain line 309. The gate electrodes 302 of TFTs 307 arranged in the row direction are commonly connected to a gate line 310. In addition, a plurality of pixel electrodes 308 connected to source electrodes of TFTs 307 are arrayed above the glass substrate 301 in the form of a matrix.

Figure 20:
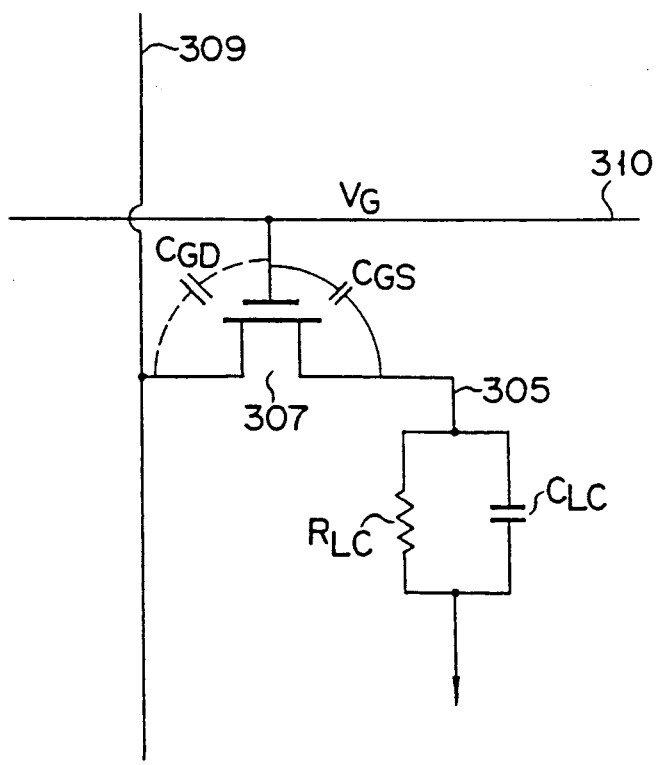
FIG. 20 is an equivalent circuit diagram of a liquid crystal display element having the TFTs illustrated in FIGS. 16 and 18.

In TFT 307, the source electrode 305 is formed so as to be smaller than the drain electrode 306. Therefore, the area where the source and the gate electrodes 305 and 302 overlap each other is considerably smaller than that where the drain and the gate electrodes 306 and 302 overlap each other. As indicated by an equivalent circuit diagram in FIG. 20, gate-source capacitance $C_{GS}$ present between the gate and the source electrodes 302 and 305 is very small. If, for example, the source electrode 305 is a circular electrode having a diameter of 4 μm and the gate insulating film 303 has a thickness of 3,000 Å as is the case with this embodiment, a gate-source capacitance $C_{GS}$ is as small as about 0.003 PF. Assuming that an equivalent capacitance $C_{LC}$ between two electrodes opposing each other through the pixel electrode 308 and a corresponding liquid crystal is set to be 0.1 PF (in a case wherein the area of the pixel electrode 308 is 100 μm × 100 μm), then a voltage drop ΔV across the source electrode 305 can be represented by:

$$\Delta V = \{C_{GS}/(C_{GS} + C_{LS})\} \cdot V_G = \{0.003/(0.003 + 0.1)\} \cdot V_G$$

This voltage drop is only about 3% of gate voltage $V_G$. As described above, since the area of the source electrode 305 is made small in this TFT, the gate-source capacitance $C_{GS}$ can be made small compared with the capacitance generated between one pixel electrode and an electrode opposing the pixel electrode through a liquid crystal. Therefore, the influences of gate signals on source potentials can be reduced, and the pixel electrode 308 can be micropatterned. In addition, since the drain electrode 306 is formed so as to surround the source electrode 305, a substantial channel width can be increased, and high drive performance of a thin film transistor can be realized.

Figure 18:
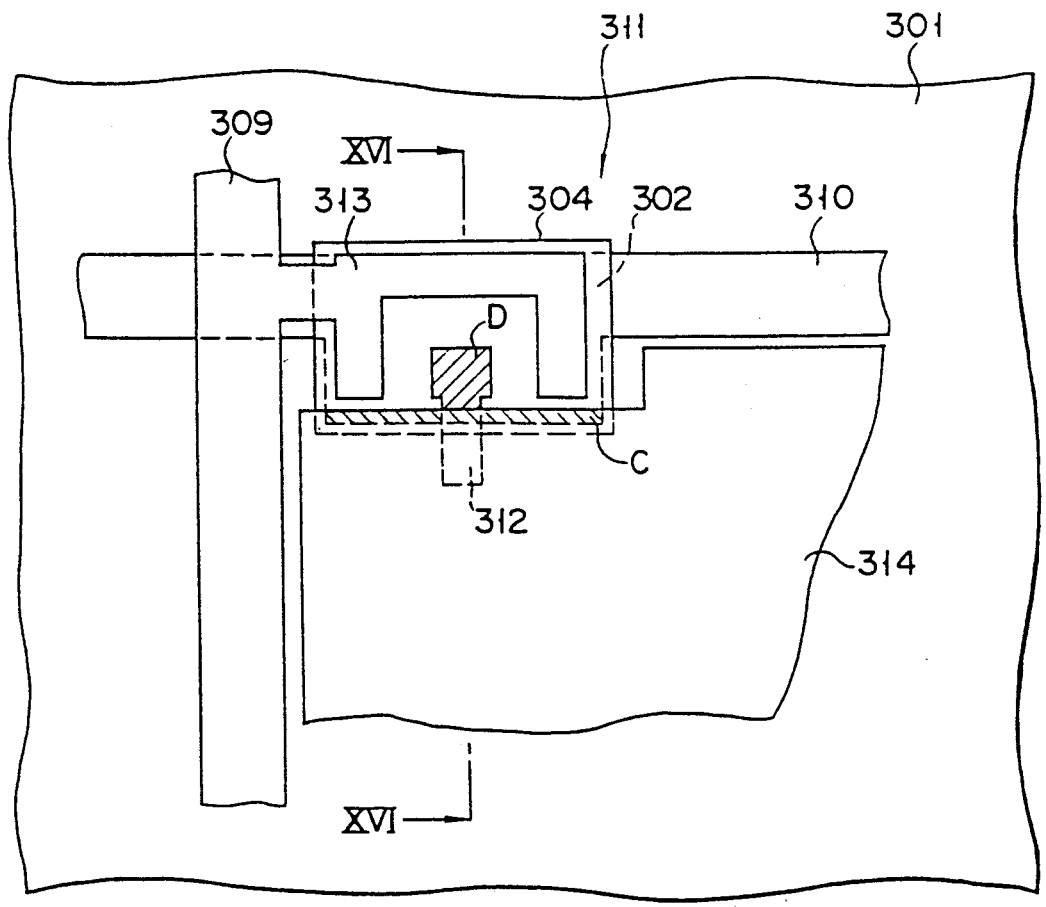
FIG. 18 is a plan view showing a modification of the TFT illustrated in FIGS. 16 and 17.
Figure 19:
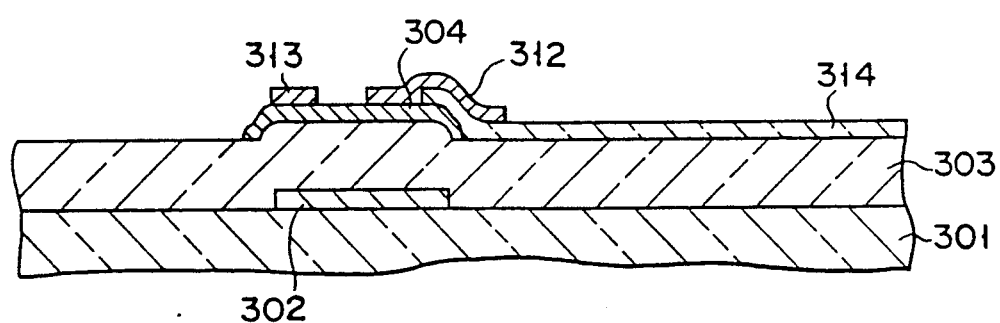
FIG. 19 is a sectional view showing the modification of the TFT shown in FIGS. 16 and 17, taken along line XVI—XVI in FIG. 18.

A structure of a TFT according to still another embodiment will be described with reference to FIGS. 18 and 19. Since the fundamental structure of this TFT is the same as that of the TFT in FIGS. 16 and 17, the same reference numerals in FIGS. 18 and 19 denote the same parts as in FIGS. 16 and 17, and a description thereof will be omitted. Referring to FIGS. 18 and 19, a source electrode 312 of TFT 311 has a rectangular shape. An U-shaped drain electrode 313 is formed, surrounding rectangular the source electrode 312. Similarly, in TFT 311, the area of the source electrode 312 is made small, and hence the area, where the source and the gate electrodes 312 and 302 overlap each other, is small. Therefore, a gate-source capacitance $C_{GS}$ between the gate and the source electrodes 302 and 312 is small, and the influence of a gate signal on a source potential is small. In addition, since a drain electrode 313 is formed, surrounding the source electrode 312, a channel width can be set to be sufficiently large.

Furthermore, in order to increase the opening ratio by increasing the area of a pixel electrode 314 as much as possible, the pixel electrode 314 is extended so that it partially overlaps the gate electrode 302 as indicated by cross-hatched portions in FIG. 18. In this case, the gate-source capacitance $C_{GS}$ between the gate and the source electrodes 302 and 312 is determined by the sum of areas D and C where the gate and the source electrodes 302 and 312, and the gate and the pixel electrodes 312 and 314 overlap each other, as indicated by the cross-hatched portions in FIG. 18. Therefore, the area C, where the gate and the pixel electrodes 302 and 314 overlap each other, and the area D, where the gate and the source electrodes 302 and 312 overlap each other, are determined such that gate-source capacitance $C_{GS}$ determined by areas C and D are much smaller than an equivalent capacitance $C_{LC}$ between one pixel electrode 314 and an electrode opposing the pixel electrode 314 through a liquid crystal.

Note that the source and the drain electrodes 312 and 313 may be formed into polygonal shapes, having no acute angles, such as a pentagon and a hexagon, or elliptical shapes.

What is claimed is:

1. A thin film transistor comprising:

a substrate;
   a gate electrode formed on said substrate and having a peripheral portion which is electrically insulative;
   a gate insulating film and a first semiconductor layer, sequentially stacked on said gate electrode, with side edge surfaces of said gate electrode, gate insulating film and first semiconductor layer all being aligned with each other to constitute two vertically-extending side edge surfaces of said gate electrode, gate insulating film and first semiconductor layer;
   two second semiconductor layers, formed on said first semiconductor layer so as to be separate from each other, with one edge surface of each of said second semiconductor layers being coplanar with one of said vertically-extending side edge surfaces;
   a source electrode formed over one of said second semiconductor layers;
   a drain electrode formed over the other of said second semiconductor layers;
   a transparent electrode electrically connected to said source electrode; and
   an insulating film electrically insulating said gate electrode and said transparent electrode from each other.

2. The thin film transistor according to claim 1, wherein said source electrode is formed directly on said one of said second semiconductor layers.

3. The thin film transistor according to claim 2, wherein said drain electrode is formed directly on said other of said second semiconductor layers.

4. The thin film transistor according to claim 1, wherein said drain electrode is formed directly on said other of said second semiconductor layers.

5. The thin film transistor according to claim 1, wherein said first semiconductor layer is made of amorphous silicon, and said second semiconductor layers are n-type semiconductor layers doped with an impurity.

6. The thin film transistor according to claim 5, wherein said n-type semiconductor layers are made of n-type amorphous silicon.

7. The thin film transistor according to claim 1, wherein said transparent electrode is a pixel electrode.

8. The thin film transistor according to claim 1, wherein the peripheral portion of said gate electrode is an oxidized portion.

9. The thin film transistor according to claim 1, wherein said gate electrode is made of aluminum, and the peripheral portion of said gate electrode is made of alumina.

* * * * *